United States Patent [19]

Shibata

[11] Patent Number: 4,914,050

[45] Date of Patent: Apr. 3, 1990

[54] SEMICONDUCTOR DEVICE AND MANUFACTURING METHOD THEREOF

[75] Inventor: Tadashi Shibata, Yokohama, Japan

[73] Assignee: Kabushiki Kaisha Toshiba, Kawasaki, Japan

[21] Appl. No.: 362,653

[22] Filed: Jun. 7, 1989

Related U.S. Application Data

[60] Division of Ser. No. 293,570, Jan. 3, 1989, Pat. No. 4,860,084, which is a continuation of Ser. No. 770,246, Aug. 28, 1985, abandoned.

[30] Foreign Application Priority Data

Sep. 3, 1984 [JP] Japan .................................. 59-182810

[51] Int. Cl.$^4$ ..................... H01L 21/22; H01L 21/467
[52] U.S. Cl. ......................................... 437/38; 437/29; 437/41; 437/203; 437/249
[58] Field of Search .................. 437/38, 29, 40, 41, 437/203, 249, 229; 357/55

[56] References Cited

U.S. PATENT DOCUMENTS

| 4,116,720 | 9/1978 | Vinson | 437/919 |
| 4,503,598 | 3/1985 | Vora et al. | 357/234 |
| 4,625,388 | 12/1986 | Rice | 437/38 |

FOREIGN PATENT DOCUMENTS 0033823 4/1981 Japan ..................................... 437/41

Primary Examiner—Brian E. Hearn
Assistant Examiner—Tom Thomas
Attorney, Agent, or Firm—Oblon, Spivak, McClelland, Maier & Neustadt

[57] ABSTRACT

A concave portion having a V-shaped cross section is formed in a contact region of a p-type silicon substrate. The contact region is defined by a hole formed in an insulative layer formed over the substrate. An n-type diffusion layer is formed in the substrate so as to surround the concave portion. The n-type diffusion layer is connected to a drain region of a FET. A metal layer is formed on the insulative layer such that the metal layer is in electric contact with the diffusion layer through the increased surface area of the concave portion in the contact region.

8 Claims, 4 Drawing Sheets

SEMICONDUCTOR DEVICE AND MANUFACTURING METHOD THEREOF

This is a division of application Ser. No. 293,570, filed on Jan. 3, 1989, now U.S. Pat. No. 4,860,084, which is a continuation of Ser. No. 770,246, filed on Aug. 28, 1985, now abandoned.

BACKGROUND OF THE INVENTION

The present invention relates to semiconductor devices and, more particularly, to semiconductor devices in which fine contact portions to connect elements with conductive wires are formed in the surface portion of a semiconductive substrate on which an integrated circuit is formed.

In recent years, the degree of integration of semiconductor integrated circuit devices has been improving every year and the number of elements formed on one chip has rapidly increased. A larger number of elements (for example, transistors) are proportionally reduced in size and mounted on a chip of a constant size. Therefore, the size of each element is decreased in inverse proportion to the increase in integration.

Theoretically, as the size of element such as a transistor decreases, the length of the carrier movement path in the substrate is reduced, increasing the operating speed of the integrated circuit. However, practically speaking, the parasitic resistance components in the wiring pattern and contact portion increase with the increase in integration, and, consequently, the improvement in operating speed of the integrated circuit is less than theoretically expected. For instance, when the size of the contact hole is reduced, the substantial contact resistance increases in the connecting portion through the contact hole between the element formed on the substrate and the connecting wire. Thus, the current driving capability in each element is suppressed and the electrical characteristics of the integrated circuit which has fine elements will be degraded. With this technical background, there is a certain limitation in the improvement in integration of the integrated circuit due to a reduction in scale.

Further, with a conventional semiconductor device, since the interface of the metal-semiconductor junction in the contact region is the flat surface, a current flowing from the connecting wire in the contact region to the element is concentrated at the edge portion of the contact surface (this state is called current crowding effect). Thus, good current supply in the contact region is obstructed.

SUMMARY OF THE INVENTION

It is therefore an object of the present invention to provide a new and improved semiconductor device which has high integration and at the same time which can improve the electrical characteristics of the component elements, and a method for manufacturing such a device.

With the semiconductor device of the present invention, a concave portion is formed in the contact region of the surface portion of a semiconductive substrate having a first conductivity type. A semiconductive layer having a second conductivity type is formed along the surface of the substrate so as to extend up to this concave portion and to surround the concave portion. Therefore, this semiconductive layer is formed into a cup shape in accordance with the cross sectional shape of the concave portion. The concave portion is deeply formed so as to have a depth larger than the thickness of the semiconductive layer formed in the remaining flat surface portion of the substrate. Consequently, the concave portion has an inner surface with an area which is substantially larger than the flat area of the contact concave portion. The conductive layer is formed over the substrate and is electrically in contact with the semiconductive layer through the whole region of the inner surface of the concave portion. Since the inner surface of the contact concave portion is substantially larger than the flat area thereof, the electrical contact characteristic between the conductive layer and the semiconductive layer is improved. Further, since the area of the interface of the conductive layer and semiconductive layer is increased, it is possible to effectively prevent the overlapped and plane current flowing from the conductive layer to the semiconductive layer from concentrating at that particular portion.

BRIEF DESCRIPTION OF THE DRAWINGS

The present invention is best understood by reference to the accompanying drawings, in which.

DETAILED DESCRIPTION OF THE PREFERRED EMBODIMENTS

Figure 1:
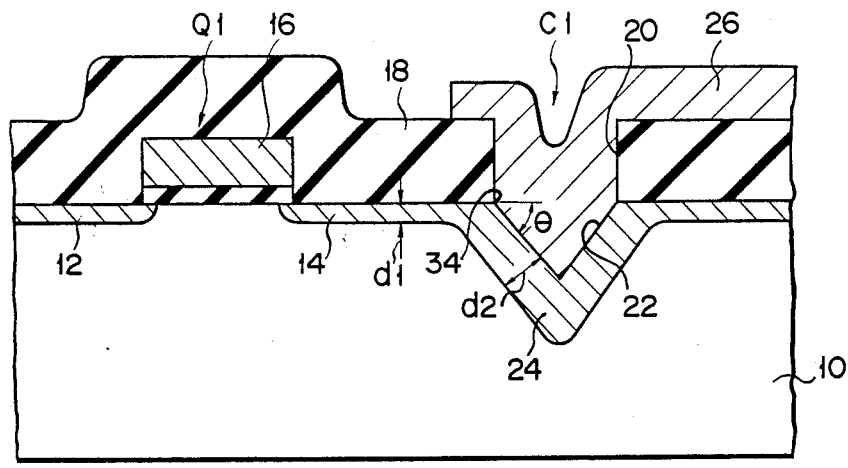
FIG. 1 is a diagram (not drawn to scale) showing a cross sectional structure of the main portion of a semiconductor integrated circuit device as the first embodiment of the present invention, in which a groove of a V-shaped cross section is formed in the contact region of the substrate.

FIG. 1 shows a cross sectional structure in the main portion of a semiconductor integrated circuit according to one preferred embodiment of the present invention. A substrate 10 is made of a p-type semiconductor material, such as silicon. A metal oxide semiconductor field effect transistor (MOS FET) $Q_1$ is formed on the silicon substrate 10. Semiconductive regions 12 and 14 of the opposite conductivity type (i.e., n-type) are formed on the surface portion of the silicon substrate 10 so as to define source and drain of the MOS FET $Q_1$. The semiconductive regions 12 and 14 are formed by way of implantation or diffusion of n-type impurities of phosphorus or arsenic. A gate layer 16 is insulated from the source and drain regions 12 and 14 and is provided above the substrate 10 substantially self-aligned with the regions 12 and 14.

In FIG. 1, the drain region 14 of the FET $Q_1$ extends in the direction of the surface of the substrate 10 and reaches a contact region $C_1$. An insulating layer 18 having an opening 20 to define the contact region $C_1$ covers the portions on and over the substrate 10 and FET $Q_1$. The insulating layer 18 may be a thermal oxidation film, a CVD $SiO_2$ film, a PSG (phosphorus glass) layer, or a BPSG (boron-phosphorus glass) layer, or a multilayer film consisting of a combination of these layers. Since the active elements including the FET $Q_1$ are integrated on and over the substrate 10 at a high density, the size of the opening (hereinafter, referred to as a "contact hole") 20 is reduced to less than 1 $\mu$m.

It should be noted that the surface portion of the substrate 10 which is exposed through the contact hole 20 is not flat but concave. The cross sectional shape of a concave portion 22 in the contact region of the substrate 10 is designed so as to have a slanted surface portion. According to the embodiment of FIG. 1, the concave portion 22 in the contact region $C_1$ of the substrate 10 is formed so as to have a depth larger than a thickness $d_1$ of the drain region 14 of the FET $Q_1$ and also to have a V-shaped cross section. Further, a semiconductor layer 24 of the n conductivity type is formed in the substrate 10 so as to surround the concave portion 22 having the V-shaped cross section of the substrate 10. The semiconductor layer 24 consists of a diffusion layer of impurities of phosphorus. According to this embodiment, the semiconductor layer 24 is formed so as to be continuous with the drain region 14 of the FET $Q_1$ as illustrated in FIG. 1 by performing the heat diffusion treatment after the implantation of impurities.

It should be further noted that the depth $d_1$ of the n-type layers 12 and 14 serving as source and drain of the FET $Q_1$ is different from a depth $d_2$ of the V-shaped n-type layer 24 in the contact region $C_1$. The depth $d_1$ of the n-type layers 12 and 14 is set to be smaller than the depth $d_2$ of the V-shaped n-type layer 24. This is because the performance or characteristic of the MOS FET $Q_1$ is improved as a result of the reduction in depth. When the channel length of each FET is reduced with an increase in integration of elements, the depth of the source and drain regions of each FET is decreased in accordance with it (in proportion to a decrease in channel length). This configuration can contribute greatly to improvement in fundamental characteristic of the FET $Q_1$.

A metal wiring layer 26, which is connected to the drain region of the FET $Q_1$, is made of aluminum silicon alloy. The metal wiring layer 26 is formed on the insulative layer 18 and is made to contact the V-shaped n-type diffusion layer 24 formed in the substrate 10 through the contact hole 20 formed in the layer 18 so as to surround the V-shaped contact concave portion 22. In this embodiment, the angle of inclination $\theta$ of the slanted surface of the V-shaped contact concave portion 22 is set to about 60°. Electrical contact between the metal wiring layer 26 in the contact region $C_1$ and the n-type layer 24 is made through the slanted surfaces of the V-shaped contact concave portion 22, so that the effective contact area is increased compared with when contact surface is flat.

Figure 2:
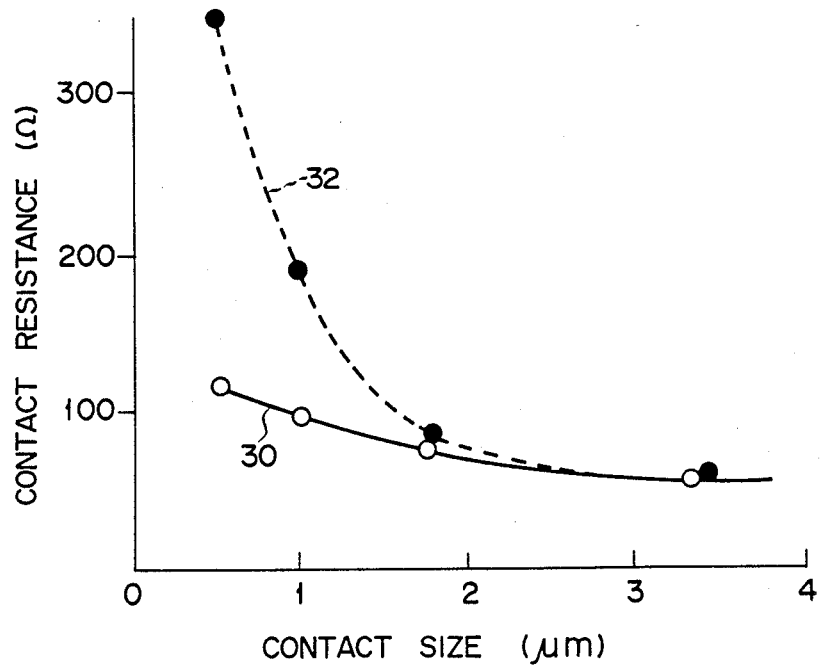
FIG. 2 is a graph showing how the contact resistance increases with a reduction in contact size in the semiconductor integrated circuit device of the present invention of FIG. 1 and a conventional semiconductor integrated circuit device.

FIG. 2 is a graph showing the contact resistance characteristic which was made on the basis of the result of a measurement with respect to how the contact resistance ($\phi$) in the contact region $C_1$ of the highly integrated semiconductor device according to the foregoing embodiment of the invention changes depending on the change in area of the contact region $C_1$. In this graph, a solid line 30 indicates the result of a measurement in the case of the present invention, while a dotted line 32 represents the result of a measurement in the case of a conventional semiconductor device having a flat contact region. In the conventional device having integration which is substantially equal to that of the device of the invention, if the metal wiring layer is in contact with the diffusion layer in the flat contact region and the size of the contact region decreases to less than 2 $\mu$m, the contact resistance suddenly increases as shown by the dotted line 32. For example, when the size of the contact region is 1 $\mu$m, the contact resistance increases to about 200 $\Omega$. When the size of the contact region is 0.6 $\mu$m, the contact resistance increases to about 350 $\Omega$. As mentioned above, with an increase in contact resistance, the operating speed of the FET is degraded and deterioration of the current driving capability, etc. occurs, causing great degradation in the electrical characteristic of the integrated circuit. To prevent these problems, according to this prior art, increasing the size of the contact region is unavoidable. This means that further improvement of integration cannot be expected any more. On the the other hand, with the semiconductor device having the V-shaped contact concave portion 22 of the present invention, even if the size of the contact region is reduced to less than 2 $\mu$m, the contact resistance does not suddenly increase but gently increases as shown by the solid line 30. For example, even when the size of the contact region is 0.6 $\mu$m, the contact resistance of the device of the present invention is suppressed to about 12 $\Omega$ and this value is about one-third that of a conventional device. Consequently, it is possible to provide a semiconductor device in which the electrical characteristics of the MOS FETs are improved while simultaneously keeping integration high.

The reason why a large difference in contact resistance in the contact region occurs between the device according to the present invention and the conventional device as mentioned above is as follows. First, the effective area of the contact portion of the metal and semiconductor is increased due to the adoption of the V-shaped contact concave portion 22. For instance, according to the foregoing embodiment, the angle of inclination $\theta$ of the slanted surface of the V-shaped contact concave portion 22 to the substrate surface is about 60°. Therefore, assuming that the flat area of the contact hole 20 formed in the insulative layer 18 is expressed as "$A_0$", the V-shaped surface area "A" becomes $$A = A_0/\cos\theta = 2 \cdot A_0$$

Namely, the V-shaped surface area "A" of the invention is increased to about twice the flat area of the contact hole 20.

Second, there is a difference in distribution of the current flowing through the contact portion of the metal wiring and semiconductor diffusion layer between the device of the present invention and the conventional device. In other words, according to the device having the recessed contact portion of the present invention, the current flow between he metal wiring layer 26 and the n-type layer 24 through the slanted surface of the concave portion 22 is substantially uniform. It is possible to prevent the current from concentrically flowing (known as "current crowding effect")

through an edge 34 of the hole 20 formed in the insulative layer 18. Thus, the current can be effectively allowed to flow through the contact interface between the metal and the semiconductor.

A manufacturing method of the semiconductor integrated circuit device of the present invention having the V-shaped contact concave portion shown in FIG. 1 will now be explained with reference to FIGS. 3A to 3D.

Figure 3A:
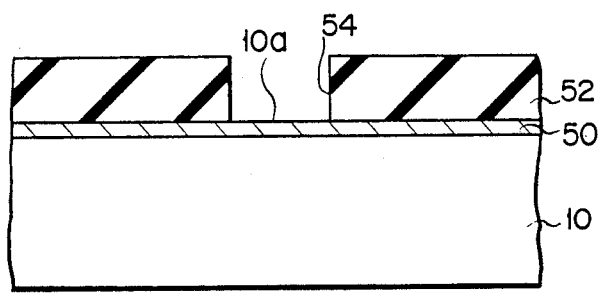
FIGS. 3A to 3D are diagrams respectively showing cross sectional structures of the main portions in the principal steps in the manufacturing process of the semiconductor integrated circuit device of FIG. 1 in which the V-shaped groove is formed in the contact region of the substrate.

Phosphorus or arsenic ions are diffused and implanted as n-type impurities into the surface portion of the p-type silicon substrate 10 to obtain an n-type semiconductive layer 50. As in the case of the device of FIG. 1, the n-type semiconductive layer 50 may be used as the source or drain region of the MOS FET; however, it may also be used as a part of wiring region on the substrate 10 other than the source or drain region. An insulative layer 52 is deposited on the n-type layer 50. The insulative layer 52 may be a thermal oxidation film, a CVD $SiO_2$ film, a PSG (phosphorus glass) layer, or a BPSG (boron-phosphorus glass) layer, or a multilayer film consisting of a combination of these layers. The substrate 10 above which the insulative layer 52 is formed is subjected to a well-known photolithography and, as shown in FIG. 3A, an opening 54 is formed in the portion of the insulative layer 52 corresponding to the contact region of the substrate 10.

Figure 3B:
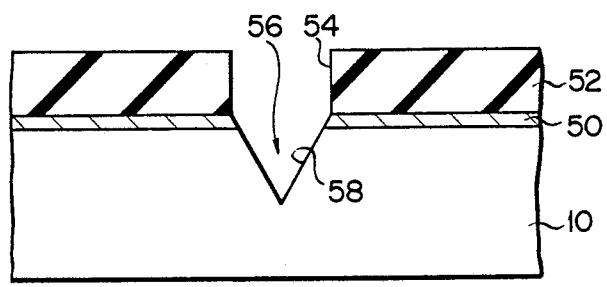

Subsequently, an anisotropic etching is performed to form a concave portion 56 having a V-shaped cross section in a partial surface 10a of the substrate 10 which is exposed through the opening 54. In this case, as an anisotropic etching technique, it is desirable to use reactive ion etching (RIE) using etching gases such as $C_xH_y$, $Cl_2$ and the like. It is also possible to use a conventional wet etching technique using an etching fluid such as KOH. Photo-excited dry etching process is also applicable. The concave portion 56 formed by this etching has slanted surfaces 58 which are inclined by only a predetermined angle with respect to the substrate surface similar to the embodiment of FIG. 1. The concave portion 56 is deeply formed so as to pierce the n-type semiconductive layer 50 formed in the surface portion of the substrate 10 as shown in FIG. 3B. The etching technology itself to form the recessed portion with the desired cross section of in the substrate 10 is well known. For instance, it is disclosed in:

(1) Y. Horiike, H. Okano, and M. Shibagaki, Proc. Microcircuit Engineering 82, Grenoble, France, pp. 203–210 (1983);
(2) A. G. Nagy, "Sidewall Tapering in Reactive Ion Etching", J. Electrochem. Soc. vol. 132, pp 689–693 (1985); or
(3) D. Chin, S. H. Dhong, and G. J. Long, "Structural Effects on a Submicron Trench Process", J. Electrochem. Soc. vol. 132, pp 1705–1707 (1985).

Figure 3C:
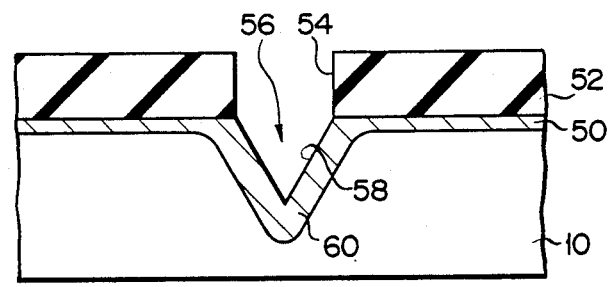
Figure 3D:
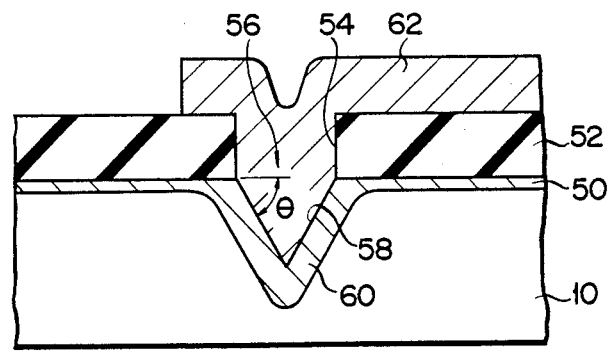

Subsequently, as shown in FIG. 3C, arsenic ions are implanted as n-type impurities into the substrate region in which the concave portion 56 having the V-shaped cross section under the condition of, for example, 50 kV and $1 \times 10^{15}/cm^{-2}$. Since the recessed contact region 58 has the V-shaped cross section, the ions can be relatively easily implanted into the recessed portion of the substrate 10. The substrate 10 into which ions were implanted is heated to a proper temperature and the implanted ions are thermally diffused, so that an n-type diffusion layer 60 is formed surrounding the V-shaped contact concave portion 56. The n-type diffusion layer 60 again connects the n-type layer 50 which was partially cut due to the formation of the V-shaped contact concave portion 56. It should be noted that the thicknesses of the n-type layers 50 and 60 (namely, the depths of the diffusion layers) differ from each other since the steps of forming the n-type layers 50 and 60 differ. The thickness of the V-shaped diffusion layer 60 may be substantially equal to, larger or smaller than the thickness of the previous diffusion layer 50.

Thereafter, a metal wiring layer 62 made of, for instance, aluminum silicon alloy is deposited on the insulative layer 52 and is sintered for a suitable period of time (for example, thirty minutes) in atmosphere of forming gas (for instance, a mixture of nitrogen and hydrogen) at a suitable temperature (e.g., 450° C.). Thus, the electrical contact is completed between the metal wiring layer 62 and the diffusion layer 60.

Figure 4:
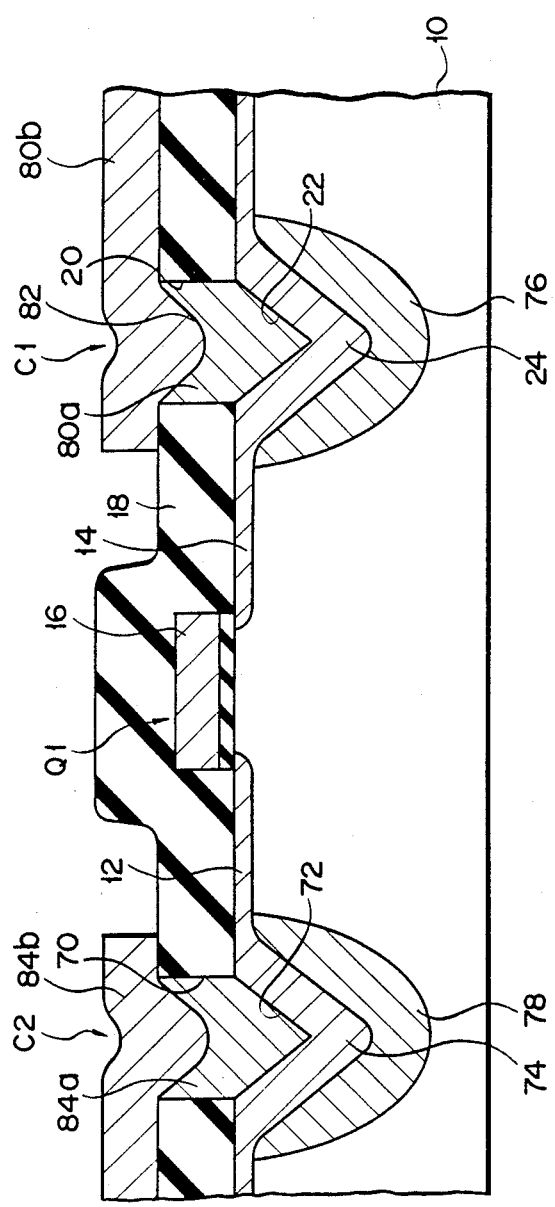
FIG. 4 is a diagram (not drawn to scale) showing a cross sectional structure in the main portion of a semiconductor integrated circuit device according to the second embodiment of the invention.

FIG. 4 shows a modified form of the semiconductor integrated circuit device having the V-shaped contact concave portion shown in FIG. 1 according to the present invention. In FIG. 4, similar portions as those in FIG. 1 are designated by the same reference numerals and detailed descriptions thereof are omitted.

In FIG. 4, the source and drain regions 12 and 14 of the MOS FET $Q_1$ extend into two contact regions $C_1$ and $C_2$. An opening 70 is formed in the insulative layer 18 and defines the second contact regions $C_2$. Similar to the first contact region $C_1$, a concave portion 72 having a V-shaped cross section is formed in the second contact region $C_2$ of the substrate 10. Another n-type diffusion layer 74 is formed so as to surround the V-shaped contact concave portion 72. The n-type diffusion layer 74 is continuously connected with the source region 12 of the FET $Q_1$ and has a thickness larger than the depth of the source region 12.

Impurities having the same conductivity type as that of the substrate 10; namely, having the p type are implanted into the contact regions $C_1$ and $C_2$ of the substrate 10 so as to provide p-type semiconductor layers 76 and 78 which surround the V-shaped thick n-type diffusion layers 24 and 74. In this embodiment, boron ions are selected as the p-type impurities. Since the V-shaped contact concave portions 22 and 72 surrounded by the p-type semiconductor layers (referred to as "p well regions" in this specification) 76 and 78 are formed on both sides of the source and drain regions 12 and 14 of one MOS FET $Q$, it is possible to prevent the occurrence of "punch through" which result in a leakage current flowing between the V-shaped contact concave portions 22 and 72. This is because a current loss from the n-type diffusion layers 24 and 74 to the substrate 10 can be reliably prevented since the concentration of p-type impurities is set to be high in the substrate portion which is in contact with the neighboring V-shaped n-type diffusion layers 24 and 74.

In the second embodiment of FIG. 4, the metal wiring layer has a double-layered structure. In the contact region $C_1$, a first metal layer (such as tungsten) 80a is buried in the contact hole 22 formed in the insulative layer 18. The contact region can be easily refilled with tungsten by using a CVD method wherein $WF_6$ gas is reduced by $H_2$ gas or silicon. As indicated at "82" in FIG. 4, the surface of the metal layer 80a is recessed and has an increased surface area. A second metal layer 80b is stacked on the insulative layer 18 so as to be electrically connected with the first metal layer 80a through the recessed surface portion 82. Consequently, a metal wiring layer 80 for the contact region $C_1$ is formed. A metal wiring layer 84 for the other contact region $C_2$ is also constructed of upper and lower metal layers 84b and 84a which are mutually stacked in the contact region $C_2$ in a similar manner as the case of the contact region $C_1$. The manufacturing of the wiring of the highly integrated semiconductor device can be simplified by adopting of such a double-layered metal wiring structure. Further, although this structure is double-layered, the upper and lower metal layers 80b and 80a (84b and 84a) are electrically in contact with each other through the increased surface portion 82 and, consequently, the contact resistance between the metals can be reduced compared with a simple flat interface.

Although the present invention has been shown and described with reference to particular embodiments, various changes and modifications which are obvious to a person skilled in the art to which the invention pertains are deemed to lie within the scope of the invention.

For example, the cross sectional shape of concave portion in the recessed contact region in the device shown in FIG. 1 is not limited to the above-mentioned V-shaped cross section but may be variably modified as illustrated in FIGS. 5 to 8, respectively. In these drawings, the similar portions as those shown in the foregoing embodiments are designated by the same reference numerals.

Figure 5:
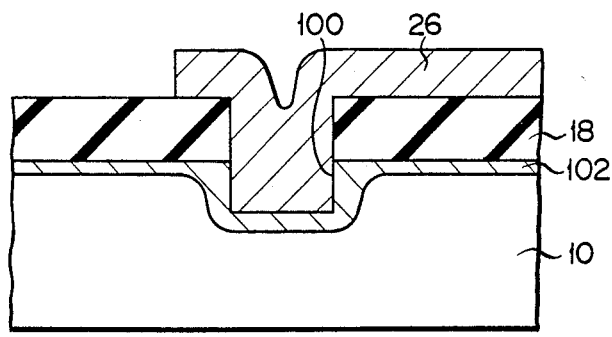
FIGS. 5 to 8 are diagrams (not drawn to scale) respectively showing cross sectional structures in the main portions of the semiconductor integrated circuit devices according to modified forms of the above embodiments of the invention.

According to the modified form shown in FIG. 5, a contact concave portion 100 formed in the p-type substrate 10 has a rectangular cross section having no slanted surface. In this case, an n-type semiconductive layer 102 into which n-type impurities were implanted is formed along the configuration of the substrate surface in the contact region of the substrate 10 so as to surround the contact concave portion 100 having a rectangular cross section. Even in this modification as well, the above-explained effect of the present invention can be derived. The n-type impurity layer 102 can be formed in the following manner. Namely, first, suitable n-type impurities are implanted into the bottom portion of the rectangular contact concave portion 100 and then this substrate is subjected to thermal diffusion treatment, so that the n-type impurity layer portion extending along the vertical wall of the rectangular contact concave portion 100 can be formed.

Figure 6:
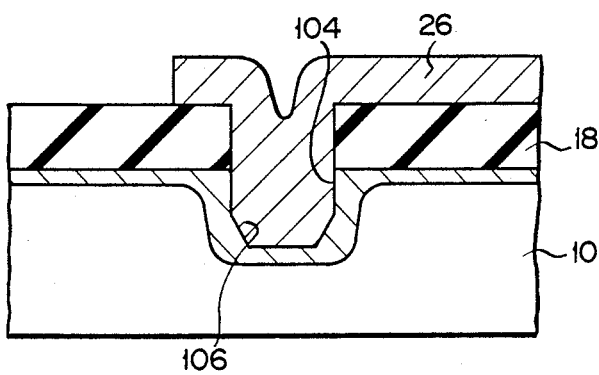
Figure 7:
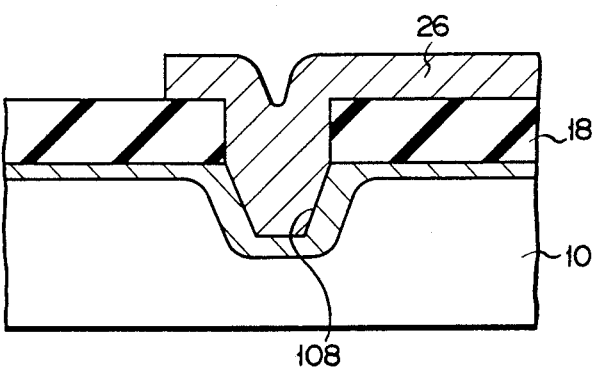
Figure 8:
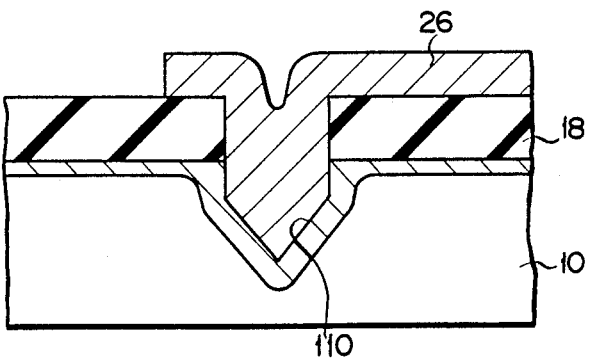

In FIG. 6, a contact concave portion 104 formed in the substrate 10 has slanted surfaces 106 at the bottom portion. In FIG. 7, a contact concave portion 108 has slanted surfaces that reach the substrate surface and also has a horizontal surface at the bottom portion. In FIG. 8, on one hand, a contact concave portion 110 has vertical side walls that reach the substrate surface and also has V-shaped slanted surfaces at the bottom portion. Even according to these modified forms as well, the above-mentioned effect of the present invention can be obtained.

The core idea of the present invention mentioned above has been described with respect to form the contact between the diffusion layer and the metal layer provided in the surface portion of the substrate. However, the present invention may be applied to form the contact of the polycrystalline silicon gate and the contact on the wiring pattern other than this gate.

What is claimed is:

1. A method for manufacturing a semiconductor device having a field effect transistor which is formed on a semiconductive substrate of a first conductivity type and which has an electrode layer insulatively disposed above said substrate, said method comprising the steps of:

(a) forming an insulative layer on said substrate having a surface in which first and second semiconductive regions of a second conductivity type are formed;
    (b) forming first and second openings in said insulative layer so as to define first and second contact holes for said first and second regions;
    (c) subjecting said substrate to an etching treatment to form first and second concave portions under said first and second openings;
    (d) doping impurities into said substrate to form third and fourth semiconductive regions of the second conductivity type, said third and fourth regions being deeper than said first and second regions;
    (e) doping impurities into said substrate so as to form fifth and sixth semiconductive regions which surround said third and fourth regions respectively; and
    (f) forming first and second conductive layers for said first and second contact holes.

2. The method according to claim 1, wherein said electrode layer serves as a gate electrode, and wherein said first and second regions act as source and drain of said transistor.

3. A method for manufacturing a semiconductor device having a metal oxide semiconductor field effect transistor which is formed on a semiconductive substrate of a first conductivity type and which has a gate electrode layer insulatively disposed above said substrate, said method comprising the steps of:

(a) forming an insulative layer on said substrate having a surface in which first and second semiconductive regions of a second conductivity type are formed to serve as source and drain of said transistor;
    (b) forming first and second openings in said insulative layer so as to define first and second contact holes for said first and second regions;
    (c) subjecting said substrate to an etching treatment to form in the surface of said substrate first and second concave portions which have inner surfaces and bottom portions and are adjacent to said first and second semiconductive regions, respectively, said first and second regions including contact portions which extend below the bottom portions of said first and second concave portions to surround said first and second concave portions, respectively;
    (d) doping impurities through said contact holes into said first and second concave portions of said substrate to form third and fourth semiconductive regions of the first conductivity type which surround said contact portions of said first and second regions, respectively; and
    (e) forming first and second conductive layers on said insulative layer so as to cover said contact holes in such a manner that they are in electrical contact with said first and second semiconductive regions through said concave portions, respectively.

4. The method according to claim 3, wherein each of said first and second concave portions is deep enough to pierce the corresponding one of said first and second semiconductive regions.

5. The method according to claim 4, wherein said first and second concave portions have a V-shaped cross-section.

6. The method according to claim 4, wherein said third and fourth regions are formed to be thicker than said first and second regions.

7. The method according to claim 4, wherein the step of forming said conductive layer comprises the substeps of:

forming in each of said first and second contact holes of said insulative layer a first metal layer having a surface recessed in accordance with the surface shape of the corresponding concave portion; and forming on said insulative layer a second metal layer which is electrically in contact with said first metal layer by the recessed surface of said first metal layer in each of said first and second contact holes.

8. The method according to claim 7, wherein said etching treatment includes an isotropic ion etching process.

* * * * *